United States Patent
Zhu

(10) Patent No.: US 10,529,873 B2
(45) Date of Patent: Jan. 7, 2020

(54) AGING RESISTANT BACKSIDE SILVER PASTE FOR CRYSTALLINE SILICON SOLAR CELLS AND PREPARATION METHOD THEREOF

(71) Applicant: NANTONG T-SUN NEW ENERGY CO., LTD., Nantong Jiangsu (CN)

(72) Inventor: Peng Zhu, Nantong Jiangsu (CN)

(73) Assignee: NANTONG T-SUN NEW ENERGY CO., LTD., Nantong Jiangsu (CN)

( * ) Notice: Subject to any disclaimer, the term of this patent is extended or adjusted under 35 U.S.C. 154(b) by 150 days.

(21) Appl. No.: 15/571,137

(22) PCT Filed: Apr. 11, 2017

(86) PCT No.: PCT/CN2017/080009
§ 371 (c)(1),
(2) Date: Nov. 1, 2017

(87) PCT Pub. No.: WO2017/198005
PCT Pub. Date: Nov. 23, 2017

(65) Prior Publication Data
US 2018/0248055 A1    Aug. 30, 2018

(30) Foreign Application Priority Data
May 16, 2016    (CN) .......................... 2016 1 0323738

(51) Int. Cl.
| | | |
|---|---|---|
| H01B 1/22 | (2006.01) | |
| B05D 5/12 | (2006.01) | |
| C09D 5/24 | (2006.01) | |
| H01L 31/0224 | (2006.01) | |
| C08L 93/04 | (2006.01) | |
| C08L 1/12 | (2006.01) | |
| C08L 1/26 | (2006.01) | |
| C08L 1/02 | (2006.01) | |
| C08L 63/00 | (2006.01) | |

(52) U.S. Cl.
CPC ........ *H01L 31/022425* (2013.01); *B05D 5/12* (2013.01); *C08L 1/02* (2013.01); *C08L 1/12* (2013.01); *C08L 1/26* (2013.01); *C08L 63/00* (2013.01); *C08L 93/04* (2013.01); *C09D 5/24* (2013.01); *H01B 1/22* (2013.01); *C08L 2203/204* (2013.01)

(58) Field of Classification Search
CPC ... H01B 1/00; H01B 1/16; H01B 1/22; B05D 5/12; C09D 5/24
See application file for complete search history.

(56) References Cited

U.S. PATENT DOCUMENTS

| | | | |
|---|---|---|---|
| 2008/0029186 A1* | 2/2008 | Abkowitz | C22C 1/0458 148/407 |
| 2011/0180139 A1* | 7/2011 | Adachi | H01B 1/22 136/256 |
| 2013/0248777 A1* | 9/2013 | Sgriccia | C03C 8/18 252/514 |
| 2015/0115018 A1* | 4/2015 | Hori | H01B 1/22 228/104 |
| 2017/0080490 A1* | 3/2017 | Tsugimoto | H01B 1/00 |
| 2017/0129058 A1* | 5/2017 | Yoshii | C03C 8/18 |
| 2017/0141245 A1* | 5/2017 | Cheng | H01L 31/022425 |
| 2018/0076343 A1* | 3/2018 | Schulz | H01L 31/022425 |

FOREIGN PATENT DOCUMENTS

| | | |
|---|---|---|
| CN | 102324263 | 1/2012 |
| CN | 102364583 | 2/2012 |
| CN | 102592703 | 7/2012 |
| CN | 102770924 | 11/2012 |
| CN | 103400633 | 11/2013 |
| CN | 105825913 | 9/2017 |
| JP | 2012028243 | 2/2012 |

OTHER PUBLICATIONS

International Search Report filed in PCT/2017/0800009 dated Jul. 20, 2017, (No English language translation provided).

* cited by examiner

*Primary Examiner* — Mark Kopec
(74) *Attorney, Agent, or Firm* — Rankin, Hill & Clark LLP

(57) ABSTRACT

The invention discloses an aging resistant backside silver paste used for the crystalline silicon solar cells and a preparation method thereof. The paste comprises 40-50 parts by weight of silver powder, 1-10 parts by weight of nano-sized copper powder, 2-10 parts by weight of lead-free glass powder, 35-55 parts by weight of organic binder, 1-5 parts by weight of other additives. The preparation method comprises the following steps: preparation of an organic binder; preparation of lead-free glass powder and preparation of an aging resistant backside silver paste. Application of the aging resistant backside silver paste used for crystalline silicon solar cells prepared in the invention may results in a dense electrode conductive layer, excellent welding properties and a distinct advantage in aging resistance.

10 Claims, No Drawings

AGING RESISTANT BACKSIDE SILVER PASTE FOR CRYSTALLINE SILICON SOLAR CELLS AND PREPARATION METHOD THEREOF

FIELD OF THE INVENTION

The invention relates to an aging resistant backside silver paste for crystalline silicon solar cells and a preparation method thereof.

BACKGROUND OF THE INVENTION

Crystalline silicon solar cells are a kind of battery devices that convert solar energy into electric energy by the use of the photoelectric effect of semiconductor silicon. In a solar cell, the internal current is produced under illumination conditions, and the electric energy is output through the frontside electrode and the backside electrode. Therefore, it is very important for solar cell electrodes have an excellent stability.

Aging resistant backside silver pastes disclosed in the invention is mainly composed of a conductive phase, an organic material and an inorganic binder. The backside silver paste is printed onto silicon wafers, sintered, and then used as the backside electrodes of the solar cells, mainly playing a role in collecting electric currents. A solar cell module is formed by series welding the cell frontside cathodes and the backside electrodes. Therefore, the stability of the welded back electrode directly affects the service life of the solar cell assembly, and the aging resistance of the backside silver pastes is very important.

With the increasing demand for the quality of the pastes used in solar cells, the aging tests of backside electrodes have been widely adopted by solar cell manufacturers. At present, the content of silver in the backside silver paste used for back electrodes is decreasing year by year, which leads to an inadequate sintering compactness and a great attenuation in the after-aging welding strength. Based on the favorable compounding of silver powder, nanosized copper powder, glass powder and organic carrier in the formula, the present invention solves the problem of the after-aging welding strength attenuation which occurred when most of the commercial backside silver pastes are used in the backside electrodes.

SUMMARY OF THE INVENTION

The Object of the Invention

The invention provides an aging resistant backside silver paste used for crystalline silicon solar cells and a preparation method thereof, in the light of the above-mentioned deficiencies of the existing technology in the art.

Technical Solution

An aging resistant backside silver paste used for crystalline silicon solar cells, comprising 40-50 parts by weight of powder silver, 1-10 parts by weight of nanosized copper powder, 2-10 parts by weight of lead-free glass powder, 35-55 parts by weight of organic binder, 1-5 parts by weight of other additives.

Preferably, the silver powders are a mixture of spherical silver powders with an average particle size of 0.5-2 µm and a specific surface area of 1-5 m²/g and flaky silver powders with an average size of 1.5-5 µm and a specific surface area of 0.5-2 m²/g. The average particle size of the nanosized copper powder is 0.01-0.1 µm.

Preferably, the organic binder is composed by one or more organic resins with different decomposition temperatures and one or more organic solvents with different volatilization rates. The mass percentage of organic resins in the organic binder is 5%-40%. The organic resins are one or more member of the group consisting of rosin, cellulose acetate, ethyl cellulose, epoxy resin, acrylic resin. The mass percentage of the organic solvents in the organic binder is 60%-95%. The organic solvents are one or more member of the group consisting of ethyl acetate, terpinol, ethylene glycol butyl ether, ethylene glycol butyl ether acetate, diethylene glycol butyl ether, diethylene glycol monobutyl ether acetate and DBE.

Preferably, the lead-free glass powder is a Bi—B—Si system, made by a melting process from several compounds selected from the group consisting of $Bi_2O_3$, $B_2O_3$, $SiO_2$, ZnO, $ZrO_2$, $Al_2O_3$, $As_2O_3$, $CaCO_3$, $K_2CO_3$, $Li_2CO_3$, $Rb_2CO_3$, $GeO_2$, $Ga_2O_3$, $Cr_2O_3$, $Co_3O_4$, NiO and $MnO_2$.

Preferably, the other additives include dispersion agents, leveling agents and coupling agents. The dispersion agents are one or more members of the group consisting of stearic acid, lauryl sodium sulfate, polyacrylamide, oleic acid amide and sinapic acid amide. The leveling agents are one or more members of the group consisting of acrylic leveling agents, polyurethane leveling agents, epoxy leveling agents and silicone leveling agents. The coupling agents are one or more members of the group consisting of silane coupling agents and titanate coupling agents.

A method for preparing the aging resistant backside silver paste for the crystalline silicon solar cell is disclosed in the present invention, including the following steps:

A. Preparation of an Organic Binder

According to the formula, mass fraction 5%-40% of organic resin, which is one or more member of the group consisting of rosin, cellulose acetate, ethyl cellulose, epoxy resin and acrylic resin, and mass fraction 60%-95% of organic solvent, which is one or two members of the group consisting of ethyl acetate, terpinol, ethylene glycol butyl ether, ethylene glycol butyl ether acetate, diethylene glycol butyl ether, diethylene glycol monobutyl ether acetate and DBE are weighed and mixed, and then heated at 50-100° C. for 1-3 h so as to dissolve the organic resin and to obtain a transparent and uniform organic binder;

B. Preparation of a Lead-Free Glass Powder

According to the formula, certain mass fractions of $Bi_2O_3$, $B_2O_3$, $SiO_2$, ZnO, $ZrO_2$, $Al_2O_3$, $As_2O_3$, $CaCO_3$, $K_2CO_3$, $Li_2CO_3$, $Rb_2CO_3$, $GeO_2$, $Ga_2O_3$, $Cr_2O_3$, $Co_3O_4$, NiO and $MnO_2$ are weighed and compounded as a glass raw material, and then melted under the temperature of 1200° C. for 3-6 h, subsequently, the molten glass raw material are put into deionized water for water quenching, and after ball milling and drying processes, a glass powder with an average size of 1-3 µm is obtained.

C. Preparation of an Aging Resistant Backside Silver Pastes

According to the formula of the backside silver paste, which is lead-free and electrically conductive, 40-50 parts by weight of silver powder, 1-10 parts by weight of nanosized copper powder, 2-10 parts by weight of lead-free glass powder, 35-55 parts by weight of organic binder, 1-5 parts by weight of other additives are weighed and well mixed, and then the mixture in the paste form is squeezed 3-10 times with a three-roller grinder to make the fineness of the paste less than 10 µm and viscosity of the paste in the range of 30-60 Pa·s, so as to obtain an aging-resistant backside silver paste used for crystalline silicon solar cells.

Beneficial Effects

As compared with the existing backside silver paste technology, the aging resistant backside silver technology disclosed in the present invention has the advantages as below:

(1) Combined use of flaky silver powder and spherical silver powder to make a mixture result in an effective improvement in the densification of the sintered silver layer, an effective retardance in permeation of the welding solder, and thus an increase in the aging resistance.

(2) Blending with a certain amount of nanosized copper powder results in an improvement in the adsorption of the welding solder in the welding strip, an effective retardance in the after-welding erosion of welding solder against silver, and thus an increase in the aging resistance.

(3) Floating of glass powder when sintered to the position adjacent to the silver surface results in an effective retardance in the after-welding erosion of welding solder against silver, and thus an increase in the aging resistance.

DETAILED DESCRIPTION OF THE PREFERRED EMBODIMENTS

The present invention is described in detail with specific embodiments.

The aging resistant backside silver paste provided by the invention consists of silver powder, nanosized copper powder, inorganic glass powder, organic binder and other additives. The silver powder, nanosized copper powder and glass powder are melted at high temperature to form a connection between the silicon substrate and the electrode. In the invention, the combined use of the spherical silver powder and flaky silver powder results in a dense silver layer produced when sintered at a high temperature, which hinders the erosion of welding solder against silver; Adding a certain amount of nanosized copper powder to the silver paste results in an improvement in the adsorption of the welding solder in the welding strip, and thus in an effective retardance in the erosion of welding solder against silver; the Bi—B—Si lead-free glass powder is used in the invention. Floating of the glass powder when sintered to the position adjacent to the silver surface results in an effective retardance in the after-welding erosion of welding solder against silver.

In order to stabilize the performance of the backside silver paste, a mixed silver powder consisting of a spherical silver powder with an average size of 0.5-2 μm and a specific surface area of 1-5 m$^2$/g and a flaky silver powder with an average size 1.5-5 μm and a specific surface area of 0.5-2 m$^2$/g is used. The average particle size of the nanosized copper powder is 0.01-0.1 μm. The particle size of the glass powder is limited in the range of 1-3 μm. The combined use of the silver powder, the nanosized copper powder and the glass powder prompts the formation of a dense silver layer when sintered. The amount of the silver powder is 40%-50%, the amount of the nanosized copper powder is 1%-10%, and the amount of the glass powder is 2%-10%, so as to ensure the electrodes have good welding properties and good electrical properties.

Embodiment 1

An aging resistant backside silver paste for crystalline silicon solar cells comprises 40 parts by weight of silver powder, 1 part of copper powder, 2 parts of lead-free glass powder, 35 parts of organic binder and 1 part of other additives.

The silver powder is a mixture of a spherical silver powder with an average size of 0.5 μm and a specific surface area of 1 m$^2$/g and a flaky silver powder with an average size 1.5 μm and a specific surface area of 0.5 m$^2$/g. The average particle size of the nanosized copper powder is 0.01 μm.

The organic binder comprises one or more organic resins with different decomposition temperatures and one or more organic solvents with different volatilization rates. The mass percentage of organic resins in the organic binder is 5%. The organic resins are one or more members of the group consisting of rosin, cellulose acetate, ethyl cellulose, epoxy resin, acrylic resin. The mass percentage of organic solvents in the organic binder is 60%. The organic solvents are one or more members of the group consisting of ethyl acetate, terpinol, ethylene glycol butyl ether, ethylene glycol butyl ether acetate, diethylene glycol butyl ether, diethylene glycol monobutyl ether acetate and DBE.

The lead-free glass powder is a Bi—B—Si system, made by a melting process from several members of the group consisting of $Bi_2O_3$, $B_2O_3$, $SiO_2$, ZnO, $ZrO_2$, $Al_2O_3$, $As_2O_3$, $CaCO_3$, $K_2CO_3$, $Li_2CO_3$, $Rb_2CO_3$, $GeO_2$, $Ga_2O_3$, $Cr_2O_3$, $Co_3O_4$, NiO and $MnO_2$.

The other additives include dispersion agents, leveling agents and coupling agents. The dispersion agents are one or more members of the group consisting of stearic acid, lauryl sodium sulfate, polyacrylamide, oleic acid amide and sinapic acid amide. The leveling agents are one or more members of the group consisting of acrylic leveling agents, polyurethane leveling agents, epoxy leveling agents and silicone leveling agents. The coupling agents are one or more members of the group consisting of silane coupling agents and titanate coupling agents.

A method for preparing the aging resistant backside silver paste for the crystalline silicon solar cell is disclosed in the invention, including the following steps:

A. Preparation of an Organic Binder

According to the formula, a mass fraction 5% of organic resins, which are one or more members of the group consisting of rosin, cellulose acetate, ethyl cellulose, epoxy resin and acrylic resin, and a mass fraction 60% of organic solvents, which are one or more members of the group consisting of ethyl acetate, terpinol, ethylene glycol butyl ether, ethylene glycol butyl ether acetate, diethylene glycol butyl ether, diethylene glycol monobutyl ether acetate and DBE, are weighed and mixed, and then heated at 50° C. for 1 h, so as to dissolve the organic resins and to obtain a transparent and uniform organic binder;

A. Preparation of a Lead-Free Glass Powder

According to the formula, certain mass fractions of $Bi_2O_3$, $B_2O_3$, $SiO_2$, ZnO, $ZrO_2$, $Al_2O_3$, $As_2O_3$, $CaCO_3$, $K_2CO_3$, $Li_2CO_3$, $Rb_2CO_3$, $GeO_2$, $Ga_2O_3$, $Cr_2O_3$, $Co_3O_4$, NiO and $MnO_2$ are weighed and compounded as a glass raw material, and then melted under the temperature of 1200° C. for 3 h, subsequently, the molten glass raw material are put into deionized water for water quenching, and after ball milling and drying processes, a glass powder with an average size of 1 μm is obtained.

B. Preparation of an Aging Resistant Backside Silver Paste

According to the formula of the backside silver paste, which is lead-free and electrically conductive, 40 parts of silver powder, 1 part of nanosized copper powder, 2 parts of lead-free glass powder, 35 parts of organic binder, 1 part of other additives are weighed and well mixed, the mixture in the paste form is squeezed 3 times with a three-roller grinder to make the fineness of the paste less than 10 μm and viscosity of the paste around 30 Pa·s, and thus an aging-resistant backside silver paste used for crystalline silicon solar cells is obtained.

Embodiment 2

An aging resistant backside silver paste for crystalline silicon solar cells comprises 50 parts by weight of silver powder, 10 parts by weight of copper powder, 10 by weight parts of lead-free glass powder, 55 parts by weight of organic binder and 5 parts by weight of other additives.

The silver powder is a mixture of a spherical silver powder with an average size of 2 μm and a specific surface area of 5 m$^2$/g and a flaky silver powder with an average size 5 μm and a specific surface area of 2 m$^2$/g. The average particle size of the nanosized copper powder is 0.1 μm.

The organic binder comprises one or more organic resins with different decomposition temperatures and one or more organic solvents with different volatilization rates. The mass percentage of organic resins in the organic binder is 40%. The organic resins are one or more members of the group consisting of rosin, cellulose acetate, ethyl cellulose, epoxy resin, acrylic resin. The mass percentage of organic solvents in the organic binder is 95%. The organic solvents are one or more members of the group consisting of ethyl acetate, terpinol, ethylene glycol butyl ether, ethylene glycol butyl ether acetate, diethylene glycol butyl ether, diethylene glycol monobutyl ether acetate and DBE.

The lead-free glass powder is a Bi—B—Si system, made by a melting process from several members of the group consisting of $Bi_2O_3$, $B_2O_3$, $SiO_2$, ZnO, $ZrO_2$, $Al_2O_3$, $As_2O_3$, $CaCO_3$, $K_2CO_3$, $Li_2CO_3$, $Rb_2CO_3$, $GeO_2$, $Ga_2O_3$, $Cr_2O_3$, $Co_3O_4$, NiO and $MnO_2$.

The other additives include dispersion agents, leveling agents and coupling agents. The dispersion agents are one or more members of the group consisting of stearic acid, lauryl sodium sulfate, polyacrylamide, oleic acid amide and sinapic acid amide. The leveling agents are one or more members of the group consisting of acrylic leveling agents, polyurethane leveling agents, epoxy leveling agents and silicone leveling agents. The coupling agents are one or more members of the group consisting of silane coupling agents and titanate coupling agents.

A method for preparing the aging resistant backside silver paste for the crystalline silicon solar cell is disclosed in the invention, including the following steps:

A. Preparation of an Organic Binder

According to the formula, a mass fraction 40% of one or more organic resins selected from the group consisting of rosin, cellulose acetate, ethyl cellulose, epoxy resin and acrylic resin, and a mass fraction 95% of one or more organic solvents selected from the group consisting of ethyl acetate, terpinol, ethylene glycol butyl ether, ethylene glycol butyl ether acetate, diethylene glycol butyl ether, diethylene glycol monobutyl ether acetate and DBE are weighed and mixed, and then heated at 100° C. for 3 h so as to dissolve the organic resins, and thus, transparent and uniform organic binder is obtained;

B. Preparation of a Lead-Free Glass Powder

According to the formula, certain mass fractions of $Bi_2O_3$, $B_2O_3$, $SiO_2$, ZnO, $ZrO_2$, $Al_2O_3$, $As_2O_3$, $CaCO_3$, $K_2CO_3$, $Li_2CO_3$, $Rb_2CO_3$, $GeO_2$, $Ga_2O_3$, $Cr_2O_3$, $Co_3O_4$, NiO and $MnO_2$ are weighed and compounded as a glass raw material, and then melted under the temperature of 1200° C. for 6 h, subsequently, the molten glass raw material are put into deionized water for water quenching, and after ball milling and drying processes, a glass powder with an average size of 1-3 μm is obtained.

C. Preparation of an Aging Resistant Backside Silver Paste

According to the formula of the backside silver paste, which is lead-free and electrically conductive, 50 parts of silver powder, 10 parts of nanosized copper powder, 10 parts of lead-free glass powder, 55 parts of organic binder, 5 parts of other additives are weighed and well mixed, the mixture in the paste form is squeezed 10 times with a three-roller grinder to make the fineness of the paste less than 10 and viscosity of the paste around 60 Pa·s, and thus an aging-resistant backside silver paste used for crystalline silicon solar cells is obtained.

Embodiment 3

An aging resistant backside silver paste for crystalline silicon solar cells comprises 45 parts by weight of silver powder, 5 parts by weight of nanosized copper powder, 5 parts by weight of lead-free glass powder, 45 parts by weight of organic binder and 3 parts by weight of other additives.

The silver powder is a mixture of a spherical silver powder with an average size of 1 μm and a specific surface area of 3 m$^2$/g and a flaky silver powder with an average size 3 μm and a specific surface area of 1 m$^2$/g. The average particle size of the nanosized copper powder is 0.08 μm.

The organic binder comprises one or more organic resins with different decomposition temperatures and one or more organic solvents with different volatilization rates. The mass percentage of organic resins in the organic binder is 20%. The organic resins are one or more members of the group consisting of rosin, cellulose acetate, ethyl cellulose, epoxy resin, acrylic resin. The mass percentage of organic solvents in the organic binder is 75%. The organic solvents are one or more members of the group consisting of ethyl acetate, terpinol, ethylene glycol butyl ether, ethylene glycol butyl ether acetate, diethylene glycol butyl ether, diethylene glycol monobutyl ether acetate and DBE.

The lead-free glass powder is a Bi—B—Si system, made by a melting process from several members of the group consisting of $Bi_2O_3$, $B_2O_3$, $SiO_2$, ZnO, $ZrO_2$, $Al_2O_3$, $As_2O_3$, $CaCO_3$, $K_2CO_3$, $Li_2CO_3$, $Rb_2CO_3$, $GeO_2$, $Ga_2O_3$, $Cr_2O_3$, $Co_3O_4$, NiO and $MnO_2$.

The other additives include dispersion agents, leveling agents and coupling agents. The dispersion agents are one or more members of the group consisting of stearic acid, lauryl sodium sulfate, polyacrylamide, oleic acid amide and sinapic acid amide. The leveling agents are one or more members of the group consisting of acrylic leveling agents, polyurethane leveling agents, epoxy leveling agents and silicone leveling agents. The coupling agents are one or more members of the group consisting of silane coupling agents and titanate coupling agents.

A method for preparing the aging resistant backside silver paste for the crystalline silicon solar cell is disclosed in the present invention, including the following steps:

A. Preparation of an Organic Binder

According to the formula, a mass fraction 20% of one or more organic resins selected from the group consisting of rosin, cellulose acetate, ethyl cellulose, epoxy resin and acrylic resin, and a mass fraction 75% of one or more organic solvents selected from the group consisting of ethyl acetate, terpinol, ethylene glycol butyl ether, ethylene glycol butyl ether acetate, diethylene glycol butyl ether, diethylene glycol monobutyl ether acetate and DBE are weighed and mixed, and then heated at 80° C. for 2 h so as to dissolve the organic resins, and thus, transparent and uniform organic binder is obtained;

B. Preparation of a Lead-Free Glass Powder

According to the formula, certain mass fractions of $Bi_2O_3$, $B_2O_3$, $SiO_2$, ZnO, $ZrO_2$, $Al_2O_3$, $As_2O_3$, $CaCO_3$, $K_2CO_3$, $Li_2CO_3$, $Rb_2CO_3$, $GeO_2$, $Ga_2O_3$, $Cr_2O_3$, $Co_3O_4$, NiO and $MnO_2$ are weighed and compounded as a glass raw material, and then melted under the temperature of 1200° C. for 4 h, subsequently, the molten glass raw material are put into deionized water for water quenching, and after ball milling and drying processes, a glass powder with an average size of 2 μm is obtained.

C. Preparation of an Aging Resistant Backside Silver Paste

According to the formula of the backside silver paste, which is lead-free and electrically conductive, 45 parts of silver powder, 5 parts of nanosized copper powder, 5 parts of lead-free glass powder, 45 parts of organic binder, 3 parts of other additives are weighed and well mixed, the mixture in the paste form is squeezed 7 times with a three-roller grinder to make the fineness of the paste less than 10 μm and viscosity of the paste around 40 Pa·s, and thus an aging-resistant backside silver paste used for crystalline silicon solar cells is obtained.

Embodiment 4

A. Preparation of an Organic Binder 40 g of terpineol and 20 g of diethylene glycol butyl ether are weighed and mixed, and then 35 g of ethyl cellulose and 5 g of acrylic resin are added when stirred. The mixture is heated to 80° C., and then kept at 80° C. for 1.5 h to dissolve the organic resins added. An organic binder A are therefore obtained for the following use.

B. Preparation of an Backside Silver Paste 5 g of a self-made Bi—B—Si lead-free glass powder with a softening temperature of 500° C., 30 g of a flaky silver powder with an average particle size of 5 μm and a specific surface area of 1.2 m²/g, 15 g of a spherical silver powder with an average particle size of 1 μm and a specific surface area of 2.2 m²/g, 7 g of nanosized copper powder with an average particle size of 0.05μ, 40 g of the above organic binder, 1 g of oleic acid amide, 1 g of acrylic leveling agent and 1 g of titanate coupling agent are weighed and mixed. The mixture is squeezed to make the fineness of the obtained paste less than 10 μm and viscosity of the paste around 40 Pa·s, and thus an aging-resistant backside silver paste is obtained.

Embodiment 5

A. Preparation of an Organic Binder 10 g of ethyl acetate and 80 g of diethylene glycol monobutyl ether acetate are weighed and mixed, and then 3 g of epoxy resin and 7 g of acrylic resin are added when stirred. The mixture is heated to 70° C., and then kept at 70° C. for 2 h to dissolve the organic resins added. An organic binder is therefore obtained for the following use.

B. Preparation of an Backside Silver Paste 5 g of a self-made Bi—B—Si lead-free glass powder with a softening temperature of 500° C., 30 g of a flaky silver powder with an average particle size of 5 μm and a specific surface area of 1.2 m²/g, 15 g of a spherical silver powder with an average particle size of 1 μm and a specific surface area of 2.2 m²/g, 7 g of a nanosized copper powder with an average particle size of 0.05 μm, 40 g of the above organic binder, 1 g of oleic acid amide, 1 g of acrylic leveling agent and 1 g of titanate coupling agent are weighed and mixed. The mixture is squeezed to make the fineness of the obtained paste less than 10 μm and viscosity of the paste around 40 Pa·s, and thus an aging-resistant backside silver paste is obtained.

Embodiment 6

A. Preparation of an Organic Binder 15 g of ethylene glycol butyl ether, 60 g of diethylene glycol monobutyl ether acetate and 10 g of DBE are weighed and mixed, and then 5 g of cellulose acetate and 10 g of rosin are added when stirred. The mixture is heated to 90° C., and then kept at 90° C. for 1 h to dissolve the organic resins added. An organic binder is therefore obtained for the following use.

B. Preparation of a Lead-Free Backside Silver Paste 6 g of a self-made Bi—B—Si lead-free glass powder with a softening temperature of 500° C., 10 g of a flaky silver powder with an average particle size of 3 μm and a specific surface area of 1.8 m²/g, 35 g of a spherical silver powder with an average particle size of 1.8 μm and a specific surface area of 1.2 m²/g, 4 g of a nanosized copper powder with an average particle size of 0.02 μm, 40 g of the above organic binder, 1 g of sinapic acid amide, and 1 g of silane coupling agent are weighed and mixed. The mixture is squeezed to make the fineness of the obtained paste less than 10 μm and viscosity of the paste around 50 Pa·s, and thus an aging-resistant backside silver paste is obtained.

The backside silver pastes obtained from the above embodiment 4-6 are applied according to the following processes:

The backside silver pastes is printed on the solar cell wafers, dried, sintered with a sintering peak temperature of 750-850° C. with the printed aluminum paste and the printed frontside silver paste, so as to form a backside electrode.

With a 320-380° C. soldering iron, a welding strip (1.8 mm wide) dipped with welding solder is welded manually onto the backside silver electrode of a solar cell. Slowly peeling in the 180° direction is carried out with a dynamometer, and the welding pulling force is recorded.

The solar cell welded with a welding strip is heated at 150° C. for 0.5-2 h in an oven for an aging test. After the aging test, slowly peeling the welding strip in the 180° direction is carried out with a dynamometer, and the welding pulling force is recorded.

The welding pulling forces before and after the aging test are as follow:

|  | Welding Pulling Force (N) | | Welding Pulling |
| --- | --- | --- | --- |
|  | Before Aging Test | After Aging Test | Force Attenuation Rate |
| When a commercial mainstream backside silver paste was used | 4-5 | 0-2 | 50%~100% |
| When the backside silver paste of the invention was used | 6-7 | 6-7 | 0% |

The invention is not limited to the above preferred embodiments. Various other products made with the identical or similar technologies disclosed in the invention by persons skilled in the art who are enlightened from the invention, no matter any modifications or changes in shape or structure, are within the scope of the invention.

I claim:

1. An aging resistant backside silver paste used for crystalline silicon solar cells, comprising in parts by weight:
   40-50 parts by weight of silver powder,
   1-10 parts by weight of nanosized copper powder,
   2-10 parts by weight of lead-free glass powder,
   35-55 parts by weight of organic binder,
   1-5 parts by weight of other additives,
   wherein the silver powder is a mixture of
   spherical silver powders with an average particle size of 0.5-2 μm and a specific surface area of 1-5 $m^2/g$, and
   flaky silver powders with an average size of 1.5-5 μm and a specific surface area of 0.5-2 $m^2/g$; and
   wherein the average particle size of the nanosized copper powder is 0.01-0.1 μm.

2. The paste of claim 1, wherein
   the organic binder is composed by one or more organic resins with different decomposition temperatures and one or more organic solvents with different volatilization rates;
   the mass percentage of organic resins in the organic binder is 5%-40%;
   the organic resins are one or more members of the group consisting of rosin, cellulose acetate, ethyl cellulose, epoxy resin, acrylic resin;
   the mass percentage of organic solvents in the organic binder is 60%-95%;
   the organic solvents is one or more members of the group consisting of ethyl acetate, terpinol, ethylene glycol butyl ether, ethylene glycol butyl ether acetate, diethylene glycol butyl ether, diethylene glycol monobutyl ether acetate and DBE.

3. The paste of claim 1, wherein the lead-free glass powder is a Bi—B—Si system, made by a melting process from several compounds selected from the group consisting of $Bi_2O_3$, $B_2O_3$, $SiO_2$, ZnO, $ZrO_2$, $Al_2O_3$, $As_2O_3$, $CaCO_3$, $K_2CO_3$, $Li_2CO_3$, $Rb_2CO_3$, $GeO_2$, $Ga_2O_3$, $Cr_2O_3$, $Co_3O_4$, NiO and $MnO_2$.

4. The paste of claim 1, wherein
   the other additives include dispersion agents, leveling agents and coupling agents;
   the dispersion agents are one or more members of the group consisting of stearic acid, lauryl sodium sulfate, polyacrylamide, oleic acid amide and sinapic acid amide;
   the leveling agents are one or more members of the group consisting of acrylic leveling agents, polyurethane leveling agents, epoxy leveling agents and silicone leveling agents;
   the coupling agents are one or more members of the group consisting of silane coupling agents and titanate coupling agents.

5. A method for preparing the paste according to claim 1, comprising:
   A. preparing the organic binder, wherein the organic binder has a mass fraction 5%-40% of organic resin, which is one or more members of the group consisting of rosin, cellulose acetate, ethyl cellulose, epoxy resin and acrylic resin, and a mass fraction 60%-95% of organic solvent, which is one or two members of the group consisting of ethyl acetate, terpinol, ethylene glycol butyl ether, ethylene glycol butyl ether acetate, diethylene glycol butyl ether, diethylene glycol monobutyl ether acetate and DBE, which are weighed and mixed, and then heated at 50-100° C. for 1-3 h so as to dissolve the organic resin and to obtain a transparent and uniform organic binder;
   B. preparing the lead-free glass powder, wherein the lead-free glass powder has certain mass fractions of $Bi_2O_3$, $B_2O_3$, $SiO_2$, ZnO, $ZrO_2$, $Al_2O_3$, $As_2O_3$, $CaCO_3$, $K_2CO_3$, $Li_2CO_3$, $Rb_2CO_3$, $GeO_2$, $Ga_2O_3$, $Cr_2O_3$, $Co_3O_4$, NiO and $MnO_2$ which are weighed and compounded as a glass raw material, and then melted under the temperature of 1200° C. for 3-6 h to produce a molten glass raw material, which is subsequently put into deionized water for water quenching, and after ball milling and drying processes, the lead-free glass powder with an average size of 1-3 μm is obtained; and
   C. preparing the aging resistant backside silver pastes which is lead-free and electrically conductive, wherein the silver powder, the nanosized copper powder, the lead-free glass powder, the organic binder, and the other additives are weighed and well mixed to form a mixture paste form, which is squeezed 3-10 times with a three-roller grinder to make a fineness of the mixture less than 10 μm and viscosity of the mixture in the range of 30-60 Pa-s, so as to obtain aging-resistant backside silver pastes used for crystalline silicon solar cells.

6. An aging resistant backside silver paste used for crystalline silicon solar cells, comprising in parts by weight:
   40-50 parts by weight of silver powder,
   1-10 parts by weight of nanosized copper powder,
   2-10 parts by weight of lead-free glass powder,
   35-55 parts by weight of organic binder, and
   1-5 parts by weight of other additives;
   wherein the average particle size of the nanosized copper powder is 0.01-0.1 μm.

7. The paste of claim 6, wherein:
   the organic binder is composed by one or more organic resins with different decomposition temperatures and one or more organic solvents with different volatilization rates;
   the mass percentage of organic resins in the organic binder is 5%-40%;
   the organic resins are one or more members of the group consisting of rosin, cellulose acetate, ethyl cellulose, epoxy resin, acrylic resin;
   the mass percentage of organic solvents in the organic binder is 60%-95%; and
   the organic solvents is one or more members of the group consisting of ethyl acetate, terpinol, ethylene glycol butyl ether, ethylene glycol butyl ether acetate, diethylene glycol butyl ether, diethylene glycol monobutyl ether acetate and DBE.

8. The paste of claim 6, wherein the lead-free glass powder is a Bi—B—Si system, made by a melting process from several compounds selected from the group consisting of $Bi_2O_3$, $B_2O_3$, $SiO_2$, ZnO, $ZrO_2$, $Al_2O_3$, $As_2O_3$, $CaCO_3$, $K_2CO_3$, $Li_2CO_3$, $Rb_2CO_3$, $GeO_2$, $Ga_2O_3$, $Cr_2O_3$, $Co_3O_4$, NiO and $MnO_2$.

9. The paste of claim 6, wherein:
   the other additives include dispersion agents, leveling agents and coupling agents;

the dispersion agents are one or more members of the group consisting of stearic acid, lauryl sodium sulfate, polyacrylamide, oleic acid amide and sinapic acid amide;

the leveling agents are one or more members of the group consisting of acrylic leveling agents, polyurethane leveling agents, epoxy leveling agents and silicone leveling agents; and the coupling agents are one or more members of the group consisting of silane coupling agents and titanate coupling agents.

10. A method for preparing the paste according to claim 6, comprising:

A. preparing the organic binder, wherein the organic binder has a mass fraction 5%-40% of organic resin, which is one or more members of the group consisting of rosin, cellulose acetate, ethyl cellulose, epoxy resin and acrylic resin, and a mass fraction 60%-95% of organic solvent, which is one or two members of the group consisting of ethyl acetate, terpinol, ethylene glycol butyl ether, ethylene glycol butyl ether acetate, diethylene glycol butyl ether, diethylene glycol monobutyl ether acetate and DBE, which are weighed and mixed, and then heated at 50-100° C. for 1-3 h so as to dissolve the organic resin and to obtain a transparent and uniform organic binder;

B. preparing the lead-free glass powder, wherein the lead-free glass powder has certain mass fractions of $Bi_2O_3$, $B_2O_3$, $SiO_2$, ZnO, $ZrO_2$, $Al_2O_3$, $As_2O_3$, $CaCO_3$, $K_2CO_3$, $Li_2CO_3$, $Rb_2CO_3$, $GeO_2$, $Ga_2O_3$, $Cr_2O_3$, $CoSO_4$, NiO and $MnO_2$ which are weighed and compounded as a glass raw material, and then melted under the temperature of 1200° C. for 3-6 h to produce a molten glass raw material, which is subsequently put into deionized water for water quenching, and after a ball milling and a drying processes, the lead-free glass powder with an average size of 1-3 μm is obtained; and C. preparing the aging resistant backside silver paste, which is lead-free and electrically conductive, wherein the silver powder, nanosized copper powder, lead-free glass powder, organic binder, and other additives are weighed and well mixed to form a mixture in paste form, which is squeezed 3-10 times with a three-roller grinder to make a fineness of the mixture less than 10 μm and a viscosity of the mixture in the range of 30-60 Pa·s, so as to obtain the aging-resistant backside silver pastes used for crystalline silicon solar cells.

\* \* \* \* \*